United States Patent [19]

Levine

[11] Patent Number: 4,644,287

[45] Date of Patent: Feb. 17, 1987

[54] LOW NOISE SYNCHRONOUS DETECTION FOR A CHARGE TRANSFER DEVICE

[75] Inventor: Peter A. Levine, Mercer County, N.J.

[73] Assignee: RCA Corporation, Princeton, N.J.

[21] Appl. No.: 837,955

[22] Filed: Mar. 10, 1986

[51] Int. Cl.$^4$ ............................................ H03D 3/18
[52] U.S. Cl. ..................................... 329/50; 329/109; 375/24; 307/444; 307/238.5; 365/183; 365/208; 377/63; 358/213
[58] Field of Search ......................... 329/50, 109, 102; 375/24, 80, 94; 307/444, 238.1–238.8; 365/183, 206, 207, 208; 377/57, 58, 59, 60, 61, 62, 63; 358/213

[56] References Cited

U.S. PATENT DOCUMENTS

| | | | |
|---|---|---|---|
| Re. 30,087 | 8/1979 | White et al. ............................ | 377/60 |
| 4,309,624 | 1/1982 | Hynecek et al. ....................... | 377/58 |
| 4,330,753 | 5/1982 | Davy ...................................... | 329/50 |
| 4,556,851 | 12/1985 | Levine ............................ | 365/206 X |

OTHER PUBLICATIONS

Pages 54–56 of the book entitled Charge Transfer Devices by Carlo Sequin and Michael Tompsett, published in 1975.

*Primary Examiner*—Eugene R. LaRoche
*Assistant Examiner*—D. C. Mis
*Attorney, Agent, or Firm*—Eugene M. Whitacre; Lawrence C. Edelman; Peter M. Emanuel

[57] ABSTRACT

Charge transfer device output signals typically include an information component which is contaminated with both on-chip amplifier noise and reset noise. For reducing these noise components, the device output signal is applied to first and second synchronous detectors. The first synchronous detector is responsive to a first reference carrier signal for maximizing at its output the information component while the second synchronous detector is responsive to a second reference carrier for maximizing at its output the noise components. The synchronous detector output signals are then differentially combined so as to substantially reduce the noise components from the contaminated information component.

10 Claims, 4 Drawing Figures

LOW NOISE SYNCHRONOUS DETECTION FOR A CHARGE TRANSFER DEVICE

FIELD OF THE INVENTION

The present invention relates to synchronous detection of output signals from a charge transfer device, such as a charge coupled device (CCD) imager.

BACKGROUND OF THE INVENTION

Charge transfer devices such as CCDs have gained popularity in recent years for performing a wide variety of electronic functions including signal processing, signal delay and image sensing.

Charge transfer devices typically include a CCD line register which transfers charge packets to a charge sensing stage. In a CCD imager, for example, an array of charge collecting regions formed in a semiconductor substrate collects image-representative charge packets in response to an incident radiation image. These charge packets are periodically transferred to the CCD line register. The charge sensing stage includes a periodically reset floating element for developing a voltage signal having amplitude variations responsive to the serially supplied image-representative charge packets. Typically, an on-chip FET amplifier, sometimes called an "electrometer", connected to the floating element provides the imager output signal. The FET amplifier contributes two noise components to the imager output signal. The first component, commonly called "1/f" noise, is predominant at lower video-frequencies of the imager output signal, and the second component is substantially uniformly distributed over the video frequency range and establishes a minimum noise level at the higher video-frequencies. The process of periodically resetting the floating element contributes a third noise component to the imager output signal, commonly called "reset noise". Reset noise results from variations in potential left upon the floating element from one reset interval to the next. Its magnitude is proportional to the square root of the capacitance of the floating element. At the upper video-frequencies of the imager output signal, the reset noise component maybe 10-15 db larger than the minimum noise level established by the FET amplifier.

The desirability of reducing both 1/f noise and reset noise has led to the practice of correlated double sampling signal recovery. In this technique the signal on the floating element is sampled twice. First, at a time when charge dependent on reset noise, but not signal, is present in the potential well induced "under" the floating element and, second, at a time when charge dependent on reset noise and signal is present in the potential well. Each sample pair is differentially combined so as to substantially reduce the reset noise and thereby generate samples which depend substantially only on the signal. The FET amplifier induced 1/f noise is also substantially reduced by the differential combining process since it is slowly varying and has substantially the same magnitude during the first and second sample time periods. Correlated double sampling becomes less practical as its sampling rates increase. The width and spacing of the sampling pulses are reduced towards the limits imposed by the time required for charge settling under the floating element. As clock rates rise to more than a few megahertz, the correlated double sampling technique becomes progressively more difficult to employ.

U.S. Pat. No. 4,330,753 issued May 18, 1982 to L. N. Davy and entitled METHOD AND APPARATUS FOR RECOVERING A SIGNAL FROM A CHARGE TRANSFER DEVICE, describes a relatively low noise method for signal recovery from a charge transfer device output stage which includes a periodically reset FET coupled to a floating element. The FET output signal is passed through a bandpass filter (BPF) to separate the double-sideband amplitude-modulated (DSB-AM) component centered about the sixth multiple of the clocking frequency. This DSB-AM signal is heterodyned, using a synchronous detector type of demodulator, to provide a baseband spectrum signal as the recovered signal from the charge transfer device. The Davy method is effective for suppressing the 1/f noise component for two reasons. Firstly, the 1/f noise is principally confined to the lower frequency spectrum of the device output, which is suppressed by the BPF. Secondly, the 1/f noise component is at a relatively insignificant signal level as compared to the information signal level, at the multiple of the DSB-AM signal frequency which is heterodyned. Additionally, the relative duty factors and timing of the device clock signals and the device output signal are adjusted so that the amplitude of the clock signal components appearing about the sixth harmonic of the output signal are zero (theoretically). Although this reduces feedthrough of clock signals to the output signal, the reduction of reset noise (which is unrelated to clock feedthrough) is not specifically addressed by Davy. Furthermore, the information signal component of the output signal centered about the sixth multiple of the clocking frequency is relatively small and therefore the output signal may have a poor signal-to-noise characteristic. Additionally, a very wideband on-chip FET amplifier is necessary so as to pass the sixth multiple component of the output signal.

SUMMARY OF THE INVENTION

In accordance with the principles of the present invention, a charge transfer device output signal including an information component contaminated with a noise component, is detected using first and second synchronous detectors. The first synchronous detector detects the information component contaminated with noise and the second synchronous detector detects substantially only the noise component. The outputs of the first and second detectors are differentially combined for substantially reducing the noise component.

DETAILED DESCRIPTION OF THE INVENTION

Figure 1:
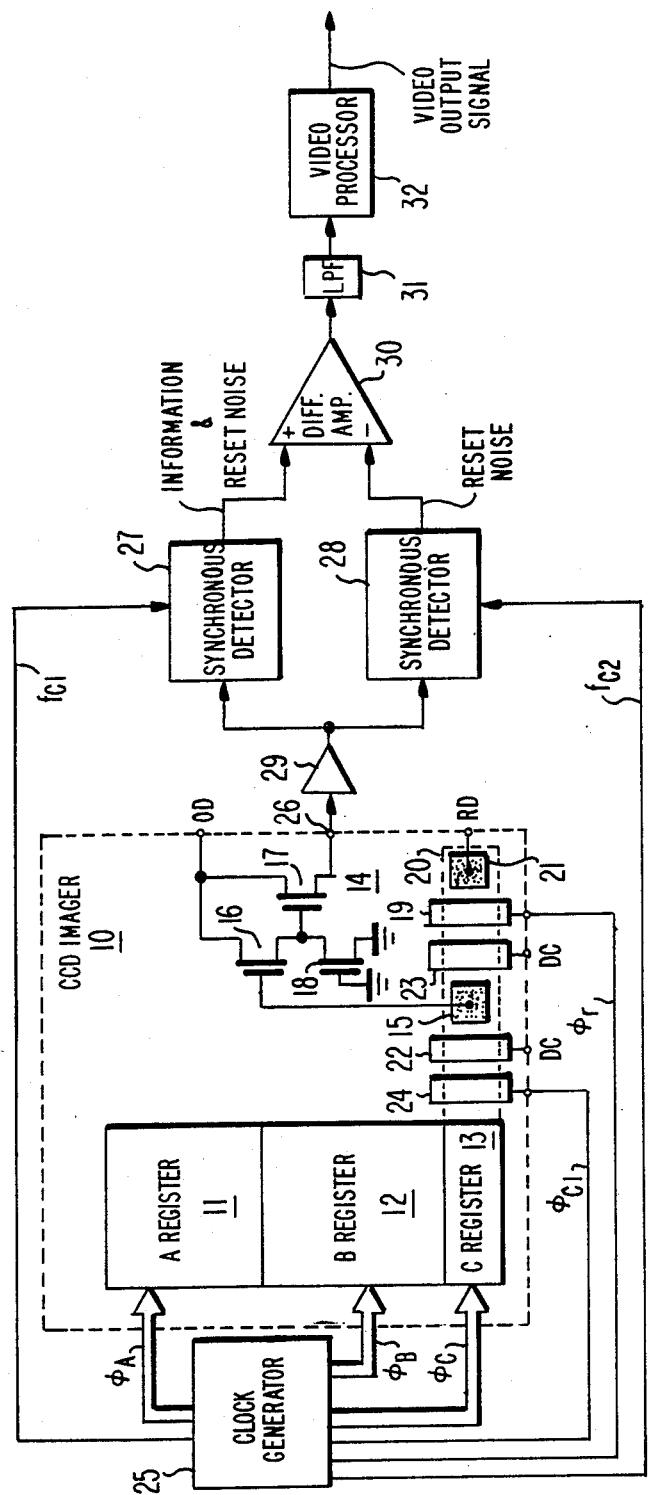
FIG. 1 illustrates, partially in block and partially in schematic diagram form, a television camera including a CCD imager using signal recovery apparatus constructed in accordance with the principles of the present invention.

In FIG. 1, the signal recovery apparatus of the invention is shown used with a semiconductor imager which, by way of example, is a CCD imager 10 of the field transfer type having n-channel CCD registers. CCD imager 10 includes an image (or A) register 11, a field storage (or B) register 12, and a parallel-input serial-output line (or C) register 13. Lines of charge packets developed in A register 11 are clocked in parallel form through B register 12 to C register 13. C register 13 serially clocks one line at a time of the charge packets to a charge sensing stage 14 including a floating-diffusion type of floating element. Sensing stage 14 includes a potential well disposed under a floating diffusion 15 which receives the charge packets clocked from the output of C register 13. Each charge packet discharges floating diffusion 15 in proportion to its size. The amount of discharge is sensed by an electrometer (a high input impedance amplifier) stage comprising a cascade connection of source-follower field effect transistors (FETs) 16 and 17. A DC potential OD is applied to the drain electrodes of FETs 16 and 17. A further FET 18 is connected as a constant current generator for FET 16. The output signal samples from CCD imager 10 are supplied via the source electrode of FET 17. After the amplitude of each charge packet is sensed, the potential on floating diffusion 15, coupled to the gate electrode of FET 16, is reset to a potential RD in response to a reset pulse $\Phi_r$ applied to a reset gate 19. Reset gate 19 is disposed over a charge transfer channel 20 which extends through C register 13 and beyond to include floating diffusion 15, a reset drain 21 to which a DC potential RD is coupled, and gates 22 and 23. Additionally, a gate 24 which precedes gate 22 is shown to indicate the last gate of C register 13 which receives a clock signal (illustrated as $\Phi_{cl}$). Gates 22 and 23 precede and follow, respectively, floating diffusion 15 and serve to decouple floating diffusion 15 from the pulse signals applied to gates 24 and 19. The configuration and operation of a CCD output stage including elements 15–24 is conventional for sensing a CCD output signal.

A clock generator 25 develops and supplies respective sets of three-phase clocking signals $\Phi_A$, $\Phi_B$ and $\Phi_C$ to imager registers 11, 12 and 13, respectively, in the well known manner for CCD imagers of the field transfer type. Clock generator 25 also generates the $\Phi_r$ pulse which is applied to gate electrode 19 of sensing stage 14 and generates $f_{c1}$ and $f_{c2}$ reference signals which are applied to synchronous detectors 27 and 28, respectively, the function of which will be described below.

Figure 2:
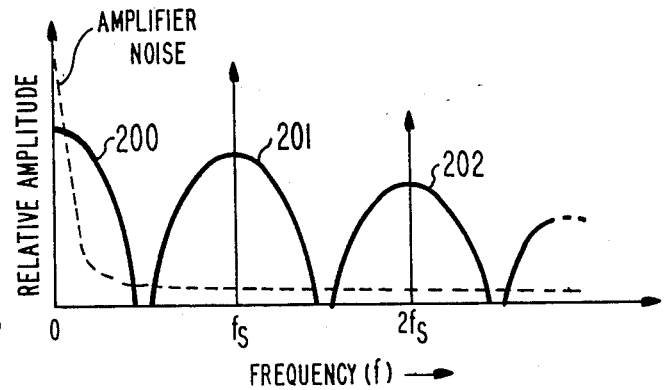
FIG. 2 illustrates an idealized output signal frequency spectrum for the CCD imager of FIG. 1.

The output signal of CCD imager 10 appears at an output terminal 26 and its frequency spectrum is illustrated in FIG. 2. The frequency spectrum of the output signal consists of a baseband frequency portion 200 which includes the image-representative signal information as well as a substantial portion of the noise generated by the amplifier including FET's 16, 17 and 18, illustrated by the dashed line, (i.e., the low frequency 1/f noise). Since the CCD output signal is a sampled signal, the image-representative signal information of baseband portion 200 is also repeated as double-sideband amplitude-modulated (DSB-AM) information components about multiples of the sampling frequency ($f_s$), as illustrated by frequency portions 201 and 202 centered about the fundamental ($f_s$) and second harmonic ($2f_s$), respectively. Note that the on-chip FET amplifier noise is not repeated in the upper frequency portions since it is added to the CCD output signal after the imager sampling process. Sampling frequency $f_s$ corresponds to the frequency of the $\Phi_C$ clock signals and is therefore equal to the charge packet repetition rate of the CCD output signal. While the amplifier noise is relatively low at the upper frequency portions (i.e., 201, 202) of the CCD output signal, as previously noted, at the upper frequency portions of the CCD output signal, the level of the reset noise (not shown) is 10–15 db greater than the amplifier noise.

In accordance with the principles of the present invention, first and second synchronous detectors 27 and 28 are responsive to the CCD output signal and first and second reference carrier signals $f_{c1}$ and $f_{c2}$, respectively, each having frequencies equal to the carrier frequency $f_s$, for frequency translating the fundamental component 201 of the CCD output signal to baseband so it can be used to provide the information signal, rather than baseband portion 200. As shown in FIG. 2, the low frequency 1/f amplifier noise is a relatively insignificant part of portion 201. In the preferred embodiment shown in FIG. 1, synchronous detectors 27 and 28 comprise doubly-balanced modulators such as included in the MC 1496 integrated circuit commercially available from Motorola Corporation. Since doubly-balanced modulators suppress feedthrough of their input signals, baseband portion 200 (which includes the 1/f amplifier noise) is suppressed at the baseband frequency portion of the detector output.

As described below, the phase of the $f_{c1}$ and $f_{c2}$ reference carrier signals are independently adjusted so that detectors 27 and 28 provide at their respective outputs a signal having a baseband portion containing the image-representative information component which is contaminated with reset noise and a signal having a baseband portion containing substantially only reset noise, respectively. A signal amplifier 29 amplifies the CCD output signal before its applied to detectors 27 and 28 so that the on-chip FET amplifier and reset noise is large compared to the noise characteristics of the detectors. The detector output signals are differentially combined by a differential amplifier 30 so as to develop at the baseband portion of its output the image-representative information signal with substantially reduced reset noise. The baseband portion of the output signal from differential amplifier 30 is selected via a low pass filter (LPF) 31, which suppresses the higher order components of the detector output signals, and applied to a conventional video signal processor 31 which develops at its output a television signal. The phase of the $f_{c1}$ and $f_{c2}$ reference carrier signals are independently adjusted so that the amplitude of the detected information component at the output of detector 27 and the reset noise component at the output of detector 28 are maximized. This adjustment can be carried out while viewing the detector outputs one at a time with an oscilloscope and slowly adjusting the phase of the appropriate reference carrier signal. For detector 27, the phase of the $f_{c1}$ signal is adjusted until the amplitude of the information component is maximized, i.e., the signal has the best signal-to-noise. For detector 28, the phase of the $f_{c2}$ signal is adjusted until the information component is mimized and the noise component maximized, i.e., the signal has the worst signal-to-noise.

Figure 3:
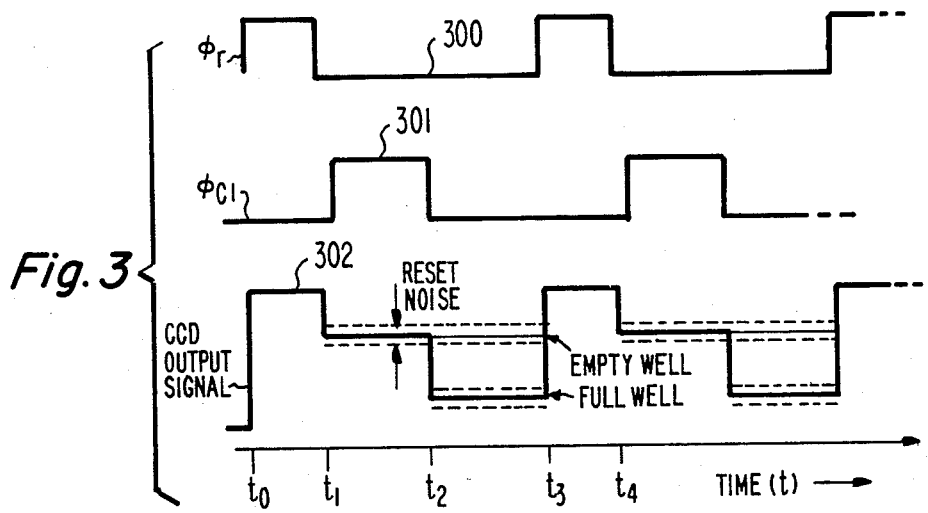
FIG. 3 illustrates waveforms useful for understanding the operation of the charge sensing apparatus of FIG. 1.

The operation of charge sensing stage 14 of FIG. 1 will next be described in greater detail, in conjunction with the waveforms of FIG. 3, in order to show how the CCD output signal is caused to be contaminated with reset noise and to explain in greater detail the adjustment of the phases of the $f_{c1}$ and $f_{c2}$ signals. In FIG. 3, time-amplitude waveform 300 illustrates the $\Phi_r$ reset signal, time-amplitude waveform 301 illustrates a $\Phi_{c1}$ clock signal (i.e., one of the $\phi_C$ clock signals) which is applied to gate 24 and time-amplitude waveform 302 illustrates an idealized version of the CCD output signal appearing at output terminal 26. During times $t_0$–$t_1$, $t_3$–$t_4$, etc., $\Phi_r$ is at a positive potential which is sufficient to allow the charge under floating diffusion 15 to drain to a potential RD applied to reset drain 21. Thus, during these times waveform 302 maintains a fixed potential. However, when the reset pulse goes low at times $t_1$, and $t_4$, etc., floating diffusion 15 is driven negatively by capacitive coupling from reset gate 19 and its potential level is set to a new level which theoretically represents zero charge. However, this new level is slightly different for each interval between $\phi_r$ reset pulses due to thermally generated noise associated with the resetting process. This gives rise to the forenoted reset noise component which appears between times $t_1$–$t_3$, etc. The amplitude range of the reset noise component is illustrated by the dashed lines in the CCD output signal between times $t_1$ and $t_3$ (greatly exaggerated to aid clarity). At time $t_2$ the potential of the $\Phi_{c1}$ clock signal changes to a level which is sufficient to cause a charge packet to transfer past DC gate 22 and under floating diffusion 15, thereby discharging floating diffusion 15 in proportion to the size of the charge packet. Thus, at time $t_2$ the potential level of waveform 302 changes by an amount dependent upon the amplitude of the image-representative signal component. Both empty well (black) and full well (white) signal levels are illustrated. At time $t_3$ the level of the CCD output signal is again reset in response to the positive going $\Phi_r$ reset signal in preparation for receipt of the next charge packet. In general, the information component and the reset noise component appearing at the output of detectors 27 and 28, respectively, are maximized when the peak value of the $f_{c1}$ signal occurs during the time interval $t_2$–$t_3$ and the peak value of the $f_{c2}$ signal occurs during the time interval $t_1$–$t_2$. Thus, the phase of the $f_{c1}$ and $f_{c2}$ signals can be initially set to these approximate phase values during manufacture so as to simplify the maximization process previously described.

Figure 4:
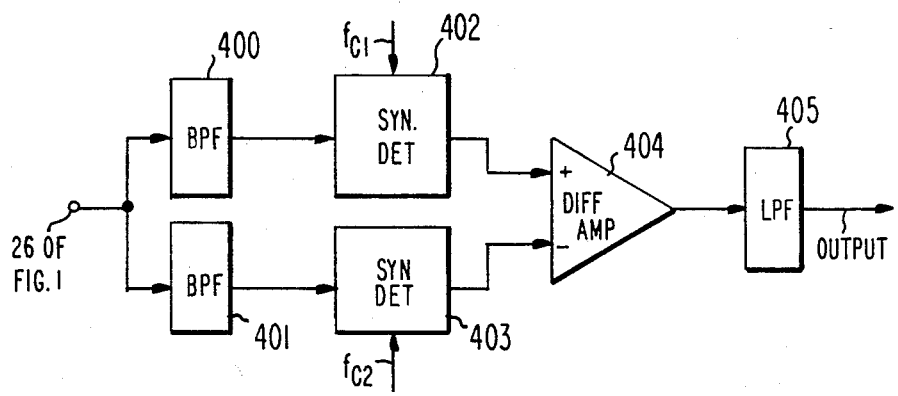
FIG. 4 illustrates an alternative embodiment of the charge sensing apparatus according to the invention.

In FIG. 1, synchronous detection is accomplished using doubly-balanced modulators. In an alternative embodiment of the invention illustrated by FIG. 4, synchronous detectors 402 and 403 are not of the type which are doubly-balanced. Detectors 402 and 403 may comprise, for example, sample and hold circuits such as used in the CCD signal sensing circuit described in my U.S. Pat. No. 4,556,851, issued Dec. 3, 1985.

Since detectors 402 and 403 are not balanced against its input signal, filtering of the CCD output signal before being applied to synchronous detectors 502 and 503 is required so as to prevent feedthrough of baseband portion 200 of FIG. 2, as will be described below. Synchronous detectors 402 and 403 are responsive to the $f_{C1}$ and $f_{C2}$ reference carrier signals, respectively, for frequency translating the fundamental component of the CCD output signal (201 of FIG. 2) to baseband frequencies. Bandpass filters (BPF) 400 and 401 serve to attenuate the low frequency 1/f noise, which may feedthrough from the input to the output of a detector which is not balanced, and to prefilter the CCD output signal so that substantially only the fundamental DSB-AM signal component is applied to synchronous detectors 402 and 403. Differential amplifier 404 corresponds to differential amplifier 29 of FIG. 1. A lowpass filter (LPF) 405 passes the baseband component of the output signal from differential amplifier 404 while rejecting the higher order signal components which are both generated by and feedthrough synchronous detectors 402 and 403. It should be noted that in this alternative embodiment, BPF's 400 and 401 could be replaced by highpass filters which suppress baseband portion 200 of FIG. 2. The higher order signal components which are not suppressed and feed through detectors 402 and 403, are suppressed by LPF 405.

While the invention has been described in connection with field transfer type CCD imagers, it should be clear that the invention is equally useful for other types of imagers as well as other types of charge transfer devices such as delay lines, signal processors, etc., where there is a need for reduction of 1/f and reset noise in the device output signal. Additionally, although charge sensing stage 14 was of the type which included a floating diffusion, it should be clear that other types of periodically reset floating elements, such as a floating gate, could also be used to sense the amplitude of transferred charge packets.

Furthermore, it should be realized that synchronous detectors could be used to detect a DSB-AM portion of the CCD output signal which is other than the fundamental portion. The fundamental portion is detected since generally its signal level has the greatest amplitude and therefore maximizes the signal-to-noise characteristic of the recovered CCD signal.

What is claimed is:

1. In combination with a charge transfer device, apparatus for recovering a charge transfer device output signal including an information component contaminated with a noise component, comprising:
   first and second synchronous detectors each responsive to said device output signal;
   said first synchronous detector being responsive to a first reference carrier signal for detecting said information component contaminated with noise and said second synchronous detector being responsive to a second reference carrier for detecting substantially only said noise component; and
   means for differentially combining the outputs of said first and second detectors for reducing said noise component from said contaminated information component.

2. Apparatus according to claim 1 wherein:
   said first and second synchronous detectors each comprise respective balanced modulators.

3. Apparatus according to claim 1 further including:
   first and second filter means for suppressing at least the baseband portion of the device output signal before it is applied to said first and second synchronous detectors.

4. Apparatus according to claim 1 wherein:
   said means for differentially combining comprises a differential amplifier.

5. Apparatus according to claim 2 wherein:
   said means for differentially combining comprises a differential amplifier.

6. Apparatus according to claim 2 further including a low pass filter coupled to the output of said means for differentially combining for passing substantially only the baseband component of said synchronous detector output signals.

7. Apparatus according to claim 3 further including a low pass filter coupled to the output of said means for differentially combining for passing substantially only the baseband component of said synchronous detector output signals.

8. Apparatus according to claim 3 wherein: said means for differentially combining comprises a differential amplifier.

9. Apparatus according to claim 3 wherein: said first and second filter means each comprise bandpass filters.

10. Apparatus according to claim 9 wherein: said bandpass filters have a passband selected to pass fundamental signal components of said charge transfer device output signal.

* * * * *